United States Patent
Shore et al.

(10) Patent No.: US 7,164,595 B1
(45) Date of Patent: Jan. 16, 2007

(54) DEVICE AND METHOD FOR USING DYNAMIC CELL PLATE SENSING IN A DRAM MEMORY CELL

(75) Inventors: Michael A. Shore, Boise, ID (US); Brian P. Callaway, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 11/212,987

(22) Filed: Aug. 25, 2005

(51) Int. Cl.
*G11C 11/24* (2006.01)

(52) U.S. Cl. .................. 365/149; 365/203; 365/207
(58) Field of Classification Search ............... 365/149, 365/207, 203, 63
See application file for complete search history.

(56) References Cited

U.S. PATENT DOCUMENTS

| | | | |
|---|---|---|---|
| 5,140,389 A | | 8/1992 | Kimura et al. |
| 5,253,205 A | * | 10/1993 | Eaton, Jr. .............. 365/189.06 |
| 5,303,183 A | * | 4/1994 | Asakura ..................... 365/149 |
| 5,357,460 A | | 10/1994 | Yusuki et al. |
| 5,610,852 A | | 3/1997 | Koike et al. |
| 6,094,369 A | | 7/2000 | Ozawa et al. |
| 6,122,213 A | | 9/2000 | Shore |
| 6,137,737 A | | 10/2000 | Mullarkey et al. |
| 6,151,244 A | * | 11/2000 | Fujino et al. ............... 365/149 |
| 6,154,387 A | | 11/2000 | Takata |
| 6,219,270 B1 | * | 4/2001 | Van Geloven et al. ...... 365/149 |
| 6,356,491 B1 | | 3/2002 | Mullarkey et al. |
| 6,477,098 B1 | * | 11/2002 | Raad ......................... 365/207 |
| 6,522,592 B1 | | 2/2003 | Van De Graaff |
| 6,549,476 B1 | | 4/2003 | Pinney |
| 6,646,905 B1 | | 11/2003 | Tada |
| 6,646,907 B1 | | 11/2003 | Ooishi |
| 6,654,297 B1 | | 11/2003 | Pinney |
| 6,686,786 B1 | | 2/2004 | Keeth et al. |
| 6,696,867 B1 | | 2/2004 | Keeth et al. |
| 6,756,836 B1 | | 6/2004 | Keeth et al. |
| 6,781,862 B1 | | 8/2004 | Takahashi et al. |
| 6,813,208 B1 | | 11/2004 | Baker |
| 6,816,398 B1 | | 11/2004 | Sakai et al. |
| 2002/0123312 A1 | | 9/2002 | Hayes et al. |

OTHER PUBLICATIONS

Keeth et al., "DRAM Circuit Design, A Tutorial," IEEE Press, 2001, pp. 1-103.

* cited by examiner

*Primary Examiner*—Anh Phung
(74) *Attorney, Agent, or Firm*—TraskBritt (57) ABSTRACT

A memory cell, device, system and method for operating a memory cell are disclosed that utilize an isolated dynamic cell plate. The memory cell includes a first and second pass transistor and a first and second capacitor. The first pass transistor and first capacitor and the second pass transistor and second capacitor are each configured in series for individual respective coupling between a first digit line and a second digit line. The first and second pass transistors are further configured for respective control by first and second wordlines. The first pass transistor and first capacitor are symmetrically configured with the second pass transistor and the second capacitor. The memory cell further includes an interconnection formed on a cell plate conductor between a terminal end of the first capacitor and a terminal end of the second capacitor. Furthermore, the interconnection is electrically isolated from other portions of the cell plate conductor. The memory device further includes a plurality of sense amplifiers configured for selectably coupling with pairs of the first and second digit lines.

20 Claims, 8 Drawing Sheets

DEVICE AND METHOD FOR USING DYNAMIC CELL PLATE SENSING IN A DRAM MEMORY CELL

BACKGROUND OF THE INVENTION

1. Field of the Invention

The present invention relates generally to memory cells, arrays and devices and, in particular, to improvement of a refresh margin in a DRAM memory device.

2. State of the Art

Memory devices are typically provided as internal storage areas in a computer. There are several different types of memory, one of which is known as random access memory (RAM) that is typically used as main memory in a computer environment. Most RAM is volatile, meaning it requires a periodic regeneration of stored electrical charge to maintain its contents. A dynamic random access memory (DRAM) is a type of RAM which is made up of cells wherein each cell or bit includes one or more transistors and capacitors. A cell is capable of storing information in the form of a "1" or "0" bit as an electrical charge on the capacitor. Since a capacitor will lose its charge over time, a memory device incorporating a DRAM cell must include logic to refresh or recharge the capacitors of the cells on a periodic basis. Otherwise, the information stored therein will fade and be lost. One form of refreshing or recharging the capacitor is performed by reading the stored data in a memory cell and then writing the data back into the cell at a predefined voltage level, causing the information to be stored for a temporary period of time.

Figure 1:
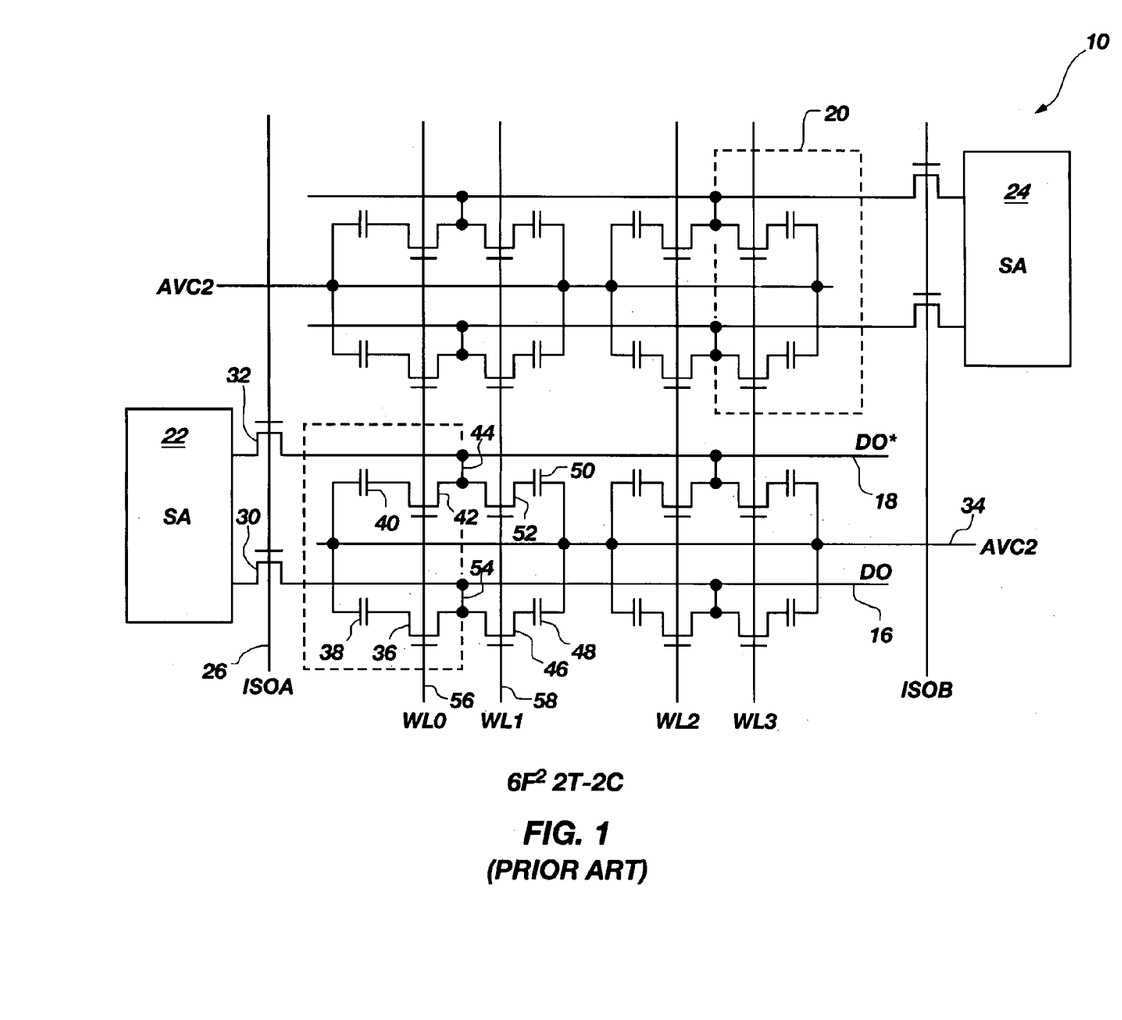
FIG. 1 is a schematic diagram of a conventional dynamic random access memory.

More specifically, a conventional 2T DRAM array 10 shown in FIG. 1 stores digital information in the form of "1" and "0" bits by storing the bits as electric charges on storage capacitors 38, 40 in a first memory cell and capacitors 48, 50 in a second memory cell as arranged along wordlines WL0 56 and WL1 58. For clarity, a single 2T memory cell 20 is depicted in an upper portion of the array and is shown to include two capacitors (2C) and two transistors (2T) and is coupled to a sense amplifier 24 when isolation gates 30, 32 are activated by a sense amp isolation signal 26. Furthermore, while DRAM array 10 is illustrated as including only eight memory cells in order to simplify description, the DRAM array 10 typically includes thousands or millions of memory cells.

The DRAM array 10 stores a "1" bit in an exemplary memory cell, for example, the memory cell comprised of pass transistor 36, storage capacitors 38, 40 and pass transistor 42, by initially energizing the wordline WL0 56 to activate the pass transistors 36, 42. The DRAM array 10 then applies a "1" bit voltage equal to a supply voltage $V_{cc}$ (e.g., 3.3 volts) to the true D0 digit line 16, causing current to flow from the digit line 16 via connection 54 through the activated pass transistor 36 and the storage capacitor 38 to a cell plate voltage 34. As the current flows, the storage capacitor 38 stores positive electric charge received from the digit line 16, causing a voltage on the storage capacitor 38 to increase. When the voltage on the storage capacitor 38 equals the "1" bit voltage on the digit line 16, current stops flowing through the storage capacitor 38. Similarly, energizing the wordline WL0 56 also activates the pass transistor 42. The DRAM array 10 then applies a "0" bit voltage equal to $V_{ss}$ (e.g., 0 volts) to the complementary D0\* digit line 18 causing current to flow from the cell plate voltage 34 to the storage capacitor 40. As the current flows, the storage capacitor 40 stores positive electric charge received from the cell plate voltage 34. A short time later, the DRAM array 10 deenergizes the wordline WL0 56 to deactivate the pass transistors 36, 42 and isolate the storage capacitors 38, 40 from the digit lines 16, 18, thereby preventing the positive electric charge stored on the storage capacitors 38, 40 from discharging back to the digit lines 16, 18.

Similarly, the DRAM array 10 stores a "0" bit in a memory cell, for example, by energizing the wordline WL0 56 to activate the pass transistors 36, 42 and applies a "0" bit voltage approximately equal to a reference voltage $V_{ss}$ (e.g., 0.0 volts) to the digit line 16, causing current to flow from the cell plate voltage 34 to the storage capacitor 38 and the activated pass transistor 36 and to the true D0 digit line 16. As the current flows, storage capacitor 38 stores electric charge received from the cell plate voltage 34 causing the cell plate voltage 34 to be stored in a negative polarity in capacitor 38. Similarly, the pass transistor 42 is also activated and causes the "1" bit voltage on complementary D0\* digit line 18 to flow through pass transistor 42 and be stored in a negative polarity in storage capacitor 40. The voltage stored across storage capacitor 40 is approximately equal to the supply voltage $V_{cc}$ minus the cell plate voltage 34. When the voltage across storage capacitors 38, 40 stabilizes, current stops flowing through the storage capacitors 38, 40 and a short time later the DRAM array 10 deenergizes the wordline WL0 56 to deactivate the pass transistors 36, 42 and isolate the storage capacitors 38, 40 from the digit lines 16, 18, thereby preventing the stored electrical charge on the storage capacitors 38, 40 from discharging back to the digit lines 16, 18.

The DRAM array 10 retrieves "1" and "0" bits stored in the manner described above in a memory cell by discharging the electric charges stored on the storage capacitors 38, 40 to the digit lines 16, 18 and then detecting a change in voltage on the digit lines 16, 18 resulting from the discharge with the sense amplifier 22 when isolation gates 30, 32 are activated by a sense amp isolation signal 26.

For example, the DRAM array 10 retrieves the "1" bit stored in the memory cell by first equilibrating the voltages on the digit lines 16, 18 to the cell plate voltage 34. The DRAM array 10 then energizes the wordline WL0 56 to activate the pass transistors 36, 42, causing the positive electric charge stored on the storage capacitor 38 to discharge through the active pass transistor 36 and negative electrical charge stored on the storage capacitor 40 to discharge through the active pass transistor 42 to the digit lines 16, 18. As a positive electric charge discharges, the voltage on the digit line 16 rises and the voltage on the digit line 18 decreases, causing a differential voltage between digit line 16 and digit line 18 as detected at sense amplifier 22. When a differential voltage between the digit lines 16 and 18 exceeds a detection threshold of the sense amplifier 22, the sense amplifier 22 responds by driving the voltage of the digit line 16 to the supply voltage $V_{cc}$ and by driving the voltage on the digit line 18 approximately to the reference voltage $V_{ss}$ and the detection of a "1" bit from the memory cell is completed.

Likewise, the DRAM array 10 retrieves the "0" bit stored in the memory cell, for example, by first equilibrating the voltages on the digit lines 16 and 18 to the cell plate voltage 34. The DRAM array 10 then energizes the wordline WL0 56 to activate the pass transistors 36, 42 causing the negative electric charge stored in the storage capacitors 38, 40 to discharge through the activated pass transistors 36, 42 and positive electrical charge stored on the storage capacitor 40 to discharge through the active pass transistor 42 to the digit lines 16 and 18. As the negative electric charge discharges, the voltage on the digit line 16 decreases below the cell plate voltage 34 and the voltage on digit line 18 increases above the cell plate voltage 34 causing a difference in voltages between digit lines 16 and 18 to exceed a detection threshold of the sense amplifier 22 causing the sense amplifier 22 to respond accordingly by driving the voltage on the digit lines 16, 18 to the appropriate voltages, namely, driving the voltage on digit line 16 to the reference voltage $V_{ss}$ and the voltage on the digit line 18 to the supply voltage $V_{cc}$.

While an ideal configuration of a DRAM array has been described for storing and retrieving the logic states that were originally stored therein, DRAM arrays sometimes contain defective memory cells which cause the stored logic states to become undetectable or at least intermittently unreliable. In some instances, this occurs because the capacitance of the storage capacitors in these memory cells are too small, preventing the capacitors from retaining a sufficient electric charge to cause a change in the sensing voltage on the digit line when discharged to the digit line, such as in the case when the discharged voltage does not adequately influence the equilibrated digit lines in such a manner as to cause the sense amplifier's detection threshold to be reached. In other instances, memory arrays and their corresponding memory cells may be defective because the electric charge stored on the storage capacitors in such memory cells leaks away through a variety of mechanisms which also prevents the capacitors from retaining a sufficient electric charge to cause a detectable change in the threshold voltage on the digit lines when the storage capacitors are discharged to the digit lines. In either case, because the change in the sensed voltage caused by the discharging of the storage capacitors cannot be detected by the sense amplifier, the "1" and "0" bits represented by the electric charges stored in the memory cells are unretrievable.

With respect to FIG. 1, the presence of a cell plate voltage 34 between the charges stored across storage capacitors 38 and 40 may deviate unequally if the cell plate voltage 34 is held to a constant voltage. For example, if a "1" bit is stored across a memory cell, a voltage potential approximately equal to $V_{cc}$ minus the cell plate voltage 34 is stored across storage capacitor 38. Similarly, a voltage of approximately the cell plate voltage 34 minus the reference voltage $V_{ss}$ is stored across storage capacitor 40. If storage capacitor 38 is defective and leaks a portion of the charge stored therein, the overall loss in stored charge is reflected only across the voltage as presented to digit line 16 during a sense operation. Accordingly, the charge coupled to digit line 16 during a sense operation may not be sufficient to exceed a sensing threshold during the sense operation. Similarly, any leakage on storage capacitor 40 would result solely in a change to the voltage as coupled to digit line 18 during a sense operation. Therefore, there is a need for an improved memory cell configuration for storing therein digit information that is less susceptible to a single defective storage capacitor.

BRIEF SUMMARY OF THE INVENTION

The present invention, in exemplary embodiments, relates to a system and method using a dynamic cell plate in a memory cell. In one embodiment of the present invention, a memory cell includes a first and second portion with the first portion including a first pass transistor and a first capacitor coupled in series and configured for coupling in series between a first digit line at a port of the first pass transistor and a cell plate conductor at a terminal end of the first capacitor. The first pass transistor is further controlled by a first wordline. The second portion of the memory cell includes a second pass transistor and a second capacitor coupled in series and configured for coupling in series between a second digit line at a port of the second pass transistor and the cell plate conductor at a terminal end of the second capacitor. The second pass transistor is further controlled by a second wordline and the first and second portions are symmetrically configured with respect to each other. The memory cell further includes an interconnection formed on the cell plate conductor between the terminal end of the first capacitor and the terminal end of the second capacitor with the interconnection being electrically isolated from other portions of the cell plate conductor.

In another embodiment of the present invention, a memory device is provided. The memory device includes a plurality of memory cells, wherein each of the memory cells includes a first and second pass transistor and a first and second capacitor. The first pass transistor and capacitor and the second pass transistor and capacitor are each configured in series for individual respective coupling between a first digit line and a second digit line. The first and second pass transistors are further configured for respective control by first and second wordlines. The first pass transistor and first capacitor are symmetrically configured with the second pass transistor and the second capacitor. The memory cell further includes an interconnection formed on a cell plate conductor between a terminal end of the first capacitor and a terminal end of the second capacitor. Furthermore, the interconnection is electrically isolated from other portions of the cell plate conductor. The memory device further includes a plurality of sense amplifiers configured for selectably coupling with pairs of the first and second digit lines.

In a further embodiment of the present invention, a semiconductor wafer is provided. The semiconductor wafer includes an integrated circuit configured as a memory array wherein the memory array includes a plurality of memory cells. Each of the memory cells includes first and second pass transistors and first and second capacitors with the first pass transistor and first capacitor and the second pass transistor and second capacitor each being configured in series for individual respective coupling between a first digit line and a second digit line. The first and second pass transistors are further configured for respective control by first and second wordlines. In the memory cell, the first pass transistor and first capacitor are symmetrically configured with the second pass transistor and second capacitor. The memory cell further includes an interconnection formed on a cell plate conductor between a terminal end of the first capacitor and a terminal end of the second capacitor. Furthermore, the interconnection is electrically isolated from other portions of the cell plate conductor.

In yet another embodiment of the present invention, an electronic system is provided. The electronic system includes an input device, an output device, a memory device, and a processor device coupled to the input, output and memory devices. The memory device comprises a memory array including a plurality of memory cells, wherein each of the memory cells includes a first and second pass transistor and a first and second capacitor. The first pass transistor and capacitor and the second pass transistor and capacitor are each configured in series for individual respective coupling between a first digit line and a second digit line. The first and second pass transistors are further configured for respective control by first and second wordlines and the first pass transistor and capacitor are symmetrically configured with the second pass transistor and capacitor. The memory cell further includes an interconnection formed on a cell plate conductor between a terminal end of the first capacitor and a terminal end of the second capacitor. Furthermore, the interconnection is electrically isolated from other portions of the cell plate conductor.

In yet a further embodiment of the present invention, a method of operating a memory array is provided. A series configured symmetrical first and second capacitors are charged to a logic potential through opposing series configured first and second pass transistors respectively coupled to first and second digit lines. The first and second digit lines are pre-charged to an intermediate reference. The logic potential of the first and second capacitors are discharged through the first and second pass transistors coupled to the first and second digit lines. At least a portion of the logic potential is sensed on the first and second digit lines to determine a logic state.

BRIEF DESCRIPTION OF THE SEVERAL VIEWS OF THE DRAWINGS

In the drawings, which illustrate what is currently considered to be the best mode for carrying out the invention.

DETAILED DESCRIPTION OF THE INVENTION

In the following detailed description of the preferred embodiments, reference is made to the accompanying drawings, which form a part hereof, and in which is shown by way of illustration specific preferred embodiments in which the inventions may be practiced. These embodiments are described in sufficient detail to enable those skilled in the art to practice the invention, and it is to be understood that other embodiments may be utilized and that logical, mechanical and electrical changes may be made without departing from the spirit and scope of the present invention. The following detailed description is, therefore, not to be taken in a limiting sense, and the scope of the present invention is defined by the claims and equivalents thereof.

It is noted that the term "pass transistor" as used herein implies a gated device that includes two ports or I/O that are coupled together through control of a gate input. Additionally, the term "capacitor" as used herein implies an information retention device whether through energy storage, structural orientation and reorientation, or otherwise.

As used herein the term "refresh margin" relates to the amounts of time that a memory cell is capable of retaining an adequate quantity of charge for accurately representing a logic state. Once the refresh margin is exceeded prior to refreshing the memory cell, the discerned logic states become unreliable.

Figure 2:
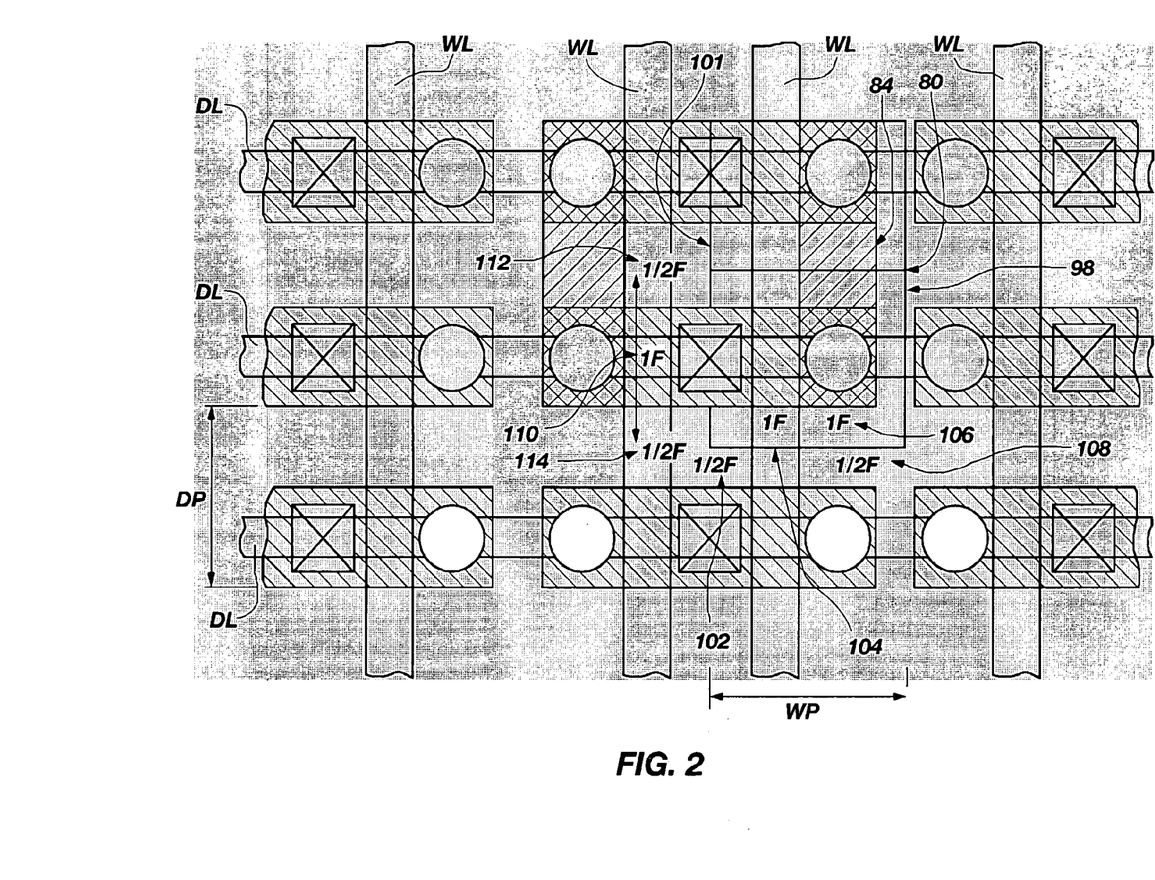
FIG. 2 is a plan view diagram of a dynamic cell plate of a memory cell, in accordance with an embodiment of the present invention.

A plan view of a portion of a DRAM memory array in accordance with the present invention is illustrated in FIG. 2. FIG. 2 illustrates an exemplary layout of a specific feature dimension, however, the present figure is illustrative and not to be considered as limiting. In this example of a DRAM memory array layout, cells are paired to share a common contact to the digit line (DL), which reduces the array size by eliminating duplication. This layout is arranged in an open digit line architecture wherein each half of memory cell 80, one half of which is shown as half 98 and another half of which is shown as half 101, has an area equal to $6F^2$. That is, the area of a memory cell 80 in this layout is described as $12F^2$. As illustrated in FIG. 2, a box is drawn around a memory cell 80 to show the cell's outer boundary. In the present embodiment, a conventional $6F^2$ memory cell process configured to include a 1T-1C memory cell architecture couples an adjacent one of a 1T-1C memory cell together through the modification of a single processing layer to form a 2T-2C memory cell without subjecting the $6F^2$ process to further modifications. The benefits of a 2T-2C architecture are manifest in an extended refresh margin by utilizing a dynamic cell plate reference to each of the capacitors in the 2T-2C architecture. Therefore, variations in a static cell plate voltage and significant leakage in a single capacitor may be minimized by the presence of a dynamic cell plate reference local to each memory cell.

By way of example, FIG. 2 illustrates the dimensioning of a $6F^2$ process for the formation of the one half 98 of the dynamic cell plate 2T-2C memory cell 80, in accordance with an embodiment of the present invention. As illustrated, along the horizontal axis of the one half 98 of memory cell 80, the box includes one-half digit line contact feature 102, one wordline feature 104, one capacitor feature 106, illustrated as a stacked capacitor, and one-half field oxide feature 108 for a total of three features. Along the vertical axis of the one half 98 of memory cell 80, the box contains two one-half field oxide features 112, 114 and one active area feature 110 for a total of two features. Therefore, the total area of one half 98 of the memory cell 80 is $3F*2F=6F^2$. Moreover, as FIG. 2 illustrates, the halves of a memory cell 80 are adjacent and connectable through isolated and an individual capacitor pair interconnect 84, which releases the memory cell 80 from being configured as a static cell plate memory cell and is thereafter configured as a dynamic cell plate memory cell 80. This is accomplished, in this example, by altering a mask layer of a $6F^2$ process for a 1T-1C memory cell process. A discussion of DRAM circuit design including open digit line architecture is provided in Brent Keeth and Jacob Baker, *DRAM Circuit Design, A Tutorial*, 1–103 (IEEE Press 2001), which is incorporated herein by reference.

Figure 3:
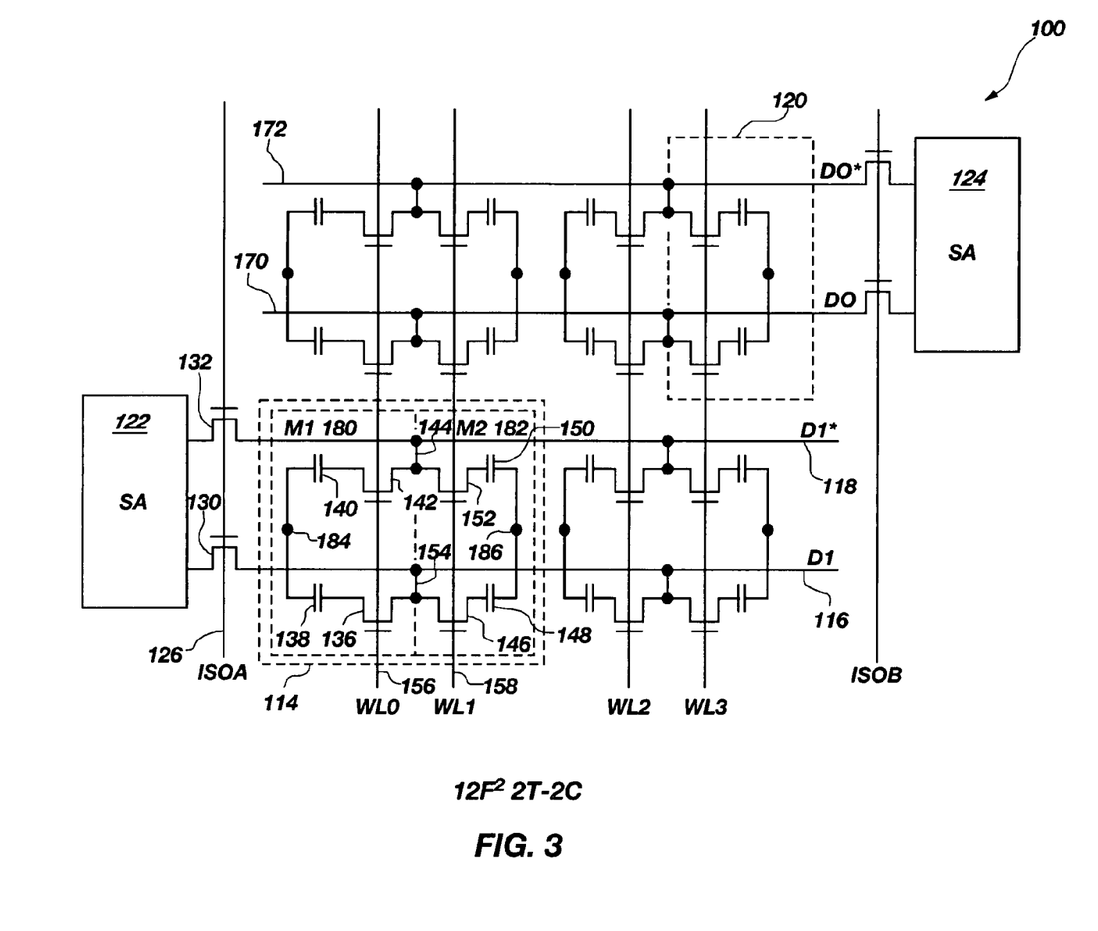
FIG. 3 is a schematic diagram of a dynamic random access memory array, in accordance with an embodiment of the present invention.

Referring to FIG. 3, a schematic diagram of a memory array 100 according to the present invention including a 1T-1C $6F^2$ portion of a memory cell of an open digit line DRAM array is illustrated, wherein the 2T-2C memory cells have an area of $12F^2$. For clarity, a single memory cell 120 is depicted in an upper portion of the array and is shown to include two capacitors (2C) and two transistors (2T) and is coupled to a sense amplifier 124 when isolation gates 130, 132 are activated by a sense amp isolation signal 126.

As illustrated, a sense amplifier 122 is coupled between digit line D1 116 and complementary digit line D1* 118 when isolation gates 130, 132 are activated by a sense amp isolation signal 126 and another sense amplifier 124 is coupled between digit line D0 170 and complementary digit line D0* 172 when isolation gates 130, 132 are activated by a sense amp isolation signal 126. Cells with a "1" bit can be expressed as having a +(Vcc−Vss)/2 stored on each capacitor 138 and 140 and cells with a "0" bit can be expressed as having a −(Vcc−Vss)/2 stored on capacitors 138 and 140. To read a memory cell, a digit line coupled to the cell and its complementary digit line are first initially equilibrated to Vcc/2 volts. Applying Vcc/2 bias voltage to the digit lines and then allowing the digit lines to float causes the digit lines to be equilibrated to Vcc/2 volts. Once the digit lines have been equilibrated to Vcc/2 volts, they remain in that state due to their capacitance. The equilibration of the digits is deactivated immediately before activating the wordline ensuring that the digits are floating when the cells and digits charge share. A voltage that is at least one transistor Vth above Vcc (this voltage is referred to as Vccp) is then applied to a wordline coupled to the cell to be read. For example, if memory cell M1 180 is to be read, a voltage of Vccp is applied to wordline WL0 156 to activate the pass transistors 136, 142 after the digit lines D1 116 and D1* 118 are equilibrated to Vcc/2. The charge on the capacitors of memory cell M1 180 is shared with digit line D1 116. In response to the shared charge, the voltage on the digit line of memory cell M1 180 either increases if memory cell M1 180 stored a 1-bit, or decreases if memory cell M1 180 stored a 0-bit. Thereafter, sense amplifier 122 compares the voltage in digit line D1 116 against the voltage in digit line D1* 118. Because of the shared buried contacts 144, 154, operation of memory cell M2 182 occurs similarly through the activation of wordline WL1 158 and the coupling of charge from capacitors 148, 150 with digit line D1 116 and digit line D1* 118 through pass transistors 146, 152.

In the various embodiments of the present invention, the refresh margin may be improved through processing a memory cell that is not statically bound to a fixed cell plate voltage, but is processed to include a dynamic cell plate node that is not fixed to a static voltage. In a memory cell architecture that includes a 2T (two transistor) memory cell, a common node or common capacitor interconnect 184 connects or associates the 2C (two capacitors) of memory cell M1 180 with each other by isolating the cell plate node from an otherwise continuous cell plate conductor or cell plate node layer that conventionally couples to each of the memory cells in a conventional memory array. In the various embodiments of the present invention, improvements in refresh margin may be obtained by modification to the continuous cell plate node layer by forming the common capacitor interconnects 184, 186 from individual isolated conductive islands in the continuous cell plate node layer that electrically couples the storage capacitors in a series configuration without further connecting the common node to a static cell plate voltage.

Figure 4:
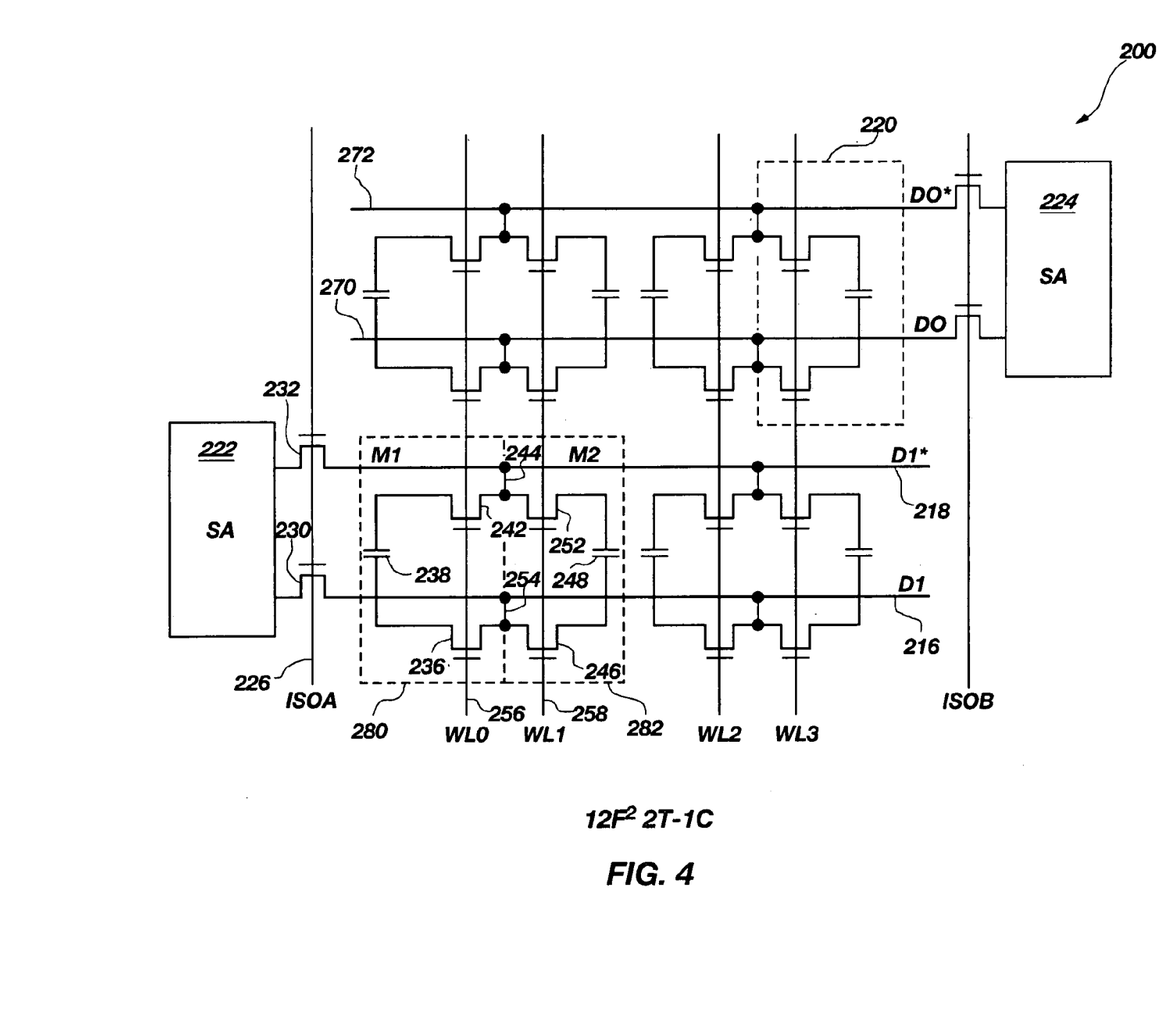
FIG. 4 is a schematic diagram of a dynamic random access memory array, in accordance with another embodiment of the present invention.

Referring to FIG. 4, a schematic diagram of a memory array 200 according to one embodiment of the present invention including a 6F² portion of a memory cell of an open digit line DRAM array is illustrated, in accordance with another embodiment of the present invention, wherein the 2T-1C memory cells have an area of 12F². For clarity, a single memory cell 220 is depicted in an upper portion of the array and is shown to include one capacitor (1C) and two transistors (2T) and is coupled to a sense amplifier 224 when isolation gates 230, 232 are activated by a sense amp isolation signal 226.

As illustrated, a sense amplifier 222 is coupled between digit line D1 216 and complementary digit line D1* 218 when isolation gates 230, 232 are activated by a sense amp isolation signal 226 and another sense amplifier 224 is coupled between digit line D0 270 and complementary digit line D0* 272 when isolation gates 230, 232 are activated by a sense amp isolation signal 226. Cells with a "1" bit can be expressed as having a +(Vcc−Vss) stored on the capacitor 238 (illustrated as a common capacitor) and cells with a "0" bit can be expressed as having a −(Vcc−Vss) stored on the capacitor 238. To read a memory cell, a digit line coupled to the cell and its complementary digit line are first initially equilibrated to Vcc/2 volts. Applying Vcc/2 bias voltage to the digit lines and then allowing the digit lines to float causes the digit lines to be equilibrated to Vcc/2 volts. Once the digit lines have been equilibrated to Vcc/2 volts, they remain in that state due to their capacitance. A voltage that is at least one transistor Vth above Vcc (this voltage is referred to as Vccp) is then applied to a wordline coupled to the cell to be read. For example, if memory cell M1 280 is to be read, a voltage of Vccp is applied to wordline WL0 256 to activate the pass transistors 236, 242 after the digit lines D1 216 and D1* 218 are equilibrated to Vcc/2. The charge on the capacitor of memory cell M1 280 is shared with digit line D1 216. In response to the shared charge, the voltage on the digit line of memory cell M1 280 either increases if memory cell M1 280 stored a 1-bit, or decreases if memory cell M1 280 stored a 0-bit. Thereafter, sense amplifier 222 compares the voltage in digit line D1 216 against the voltage in digit line D1* 218. Because of the shared buried contacts 244, 254, operation of memory cell M2 282 occurs similarly through the activation of wordline WL1 258 and the coupling of charge from the capacitor 248 with digit line D1 216 and digit line D1* 218 through pass transistors 246, 252.

In the present embodiment of the invention, the refresh margin may be improved through processing a memory cell that is not statically bound to a fixed cell plate voltage but is processed to include a dynamic cell plate node that is not fixed to a static voltage. In a memory cell architecture that includes a 2T (two transistor) memory cell M1 280, a common capacitor 238 connects and isolates the cell plate node from an otherwise continuous cell plate node layer that conventionally couples to each of the memory cells in a conventional memory array. In the various embodiments of the present invention, improvements in refresh margin may be obtained by modification to the otherwise continuous cell plate node layer by forming the common capacitor 238 without further connecting to a static cell plate voltage.

Figure 5:
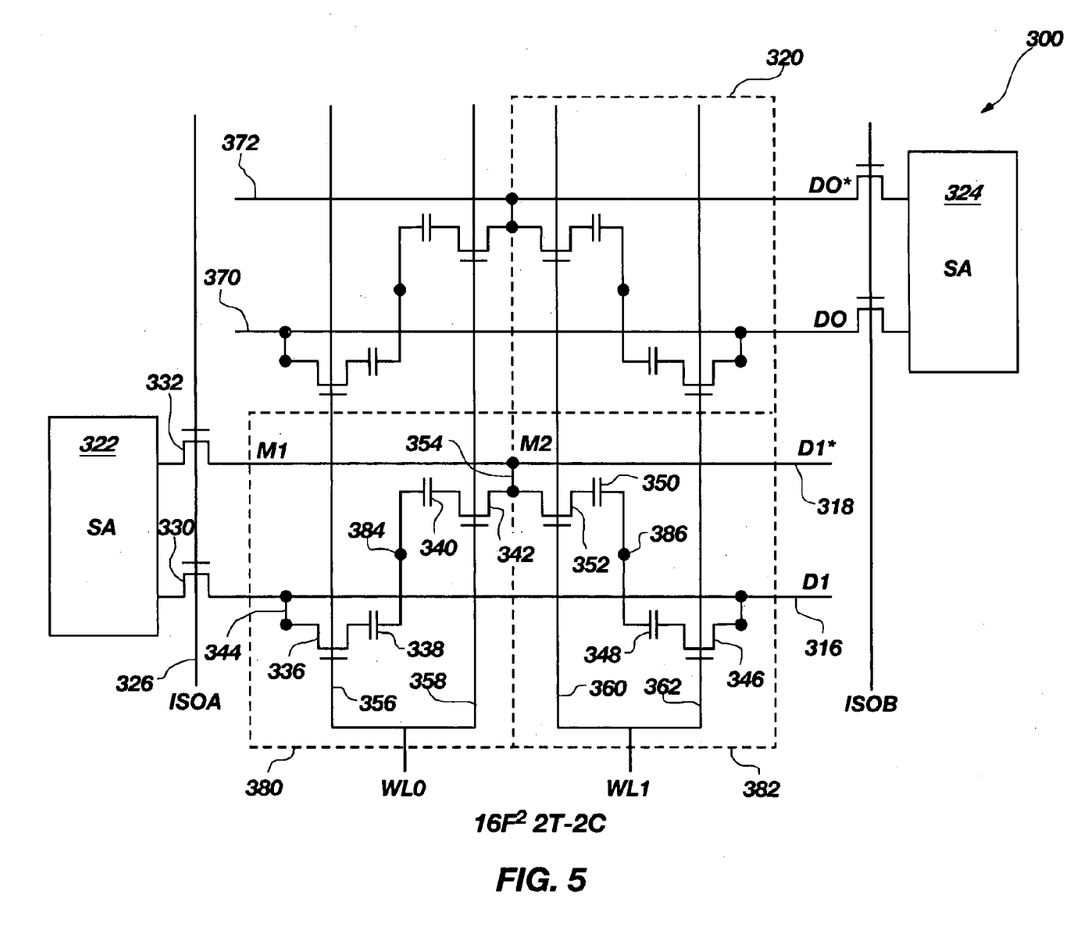
FIG. 5 is a schematic diagram of a dynamic random access memory array, in accordance with a further embodiment of the present invention.

Referring to FIG. 5, a schematic diagram of a memory array 300 according to one embodiment of the present invention including a 1T-1C 8F² portion of a memory cell of an open digit line DRAM array is illustrated, wherein the 2T-2C memory cells have an area of 16F². For clarity, a single memory cell 320 is depicted in an upper portion of the array and is shown to include two capacitors (2C) and two transistors (2T) and is coupled to a sense amplifier 324 when isolation gates 330, 332 are activated by a sense amp isolation signal 326.

As illustrated, a sense amplifier 322 is coupled between digit line D1 316 and complementary digit line D1* 318 when isolation gates 330, 332 are activated by a sense amp isolation signal 326 and another sense amplifier 324 is coupled between digit line D0 370 and complementary digit line D0* 372 when isolation gates 330, 332 are activated by a sense amp isolation signal 326. Cells with a "1" bit can be expressed as having a +(Vcc−Vss)/2 stored on each capacitor 338 and 340 and cells with a "0" bit can be expressed as having a −(Vcc−Vss)/2 stored on capacitors 338 and 340. To read a memory cell, a digit line coupled to the cell and its complementary digit line are first initially equilibrated to Vcc/2 volts. Applying Vcc/2 bias voltage to the digit lines and then allowing the digit lines to float causes the digit lines to be equilibrated to Vcc/2 volts. Once the digit lines have been equilibrated to Vcc/2 volts, they remain in that state due to their capacitance. A voltage that is at least one transistor Vth above Vcc (this voltage is referred to as Vccp) is then applied to a wordline coupled to the cell to be read. For example, if cell M1 380 is to be read, a voltage of Vccp is applied to wordline WL0 356, 358 to activate the pass transistors 336, 342 after the digit lines D1 316 and D1* 318 are equilibrated to Vcc/2. The charge on the capacitors of memory cell M1 380 is shared with digit line D1 316. In response to the shared charge, the voltage on the digit line of memory cell M1 380 either increases if memory cell M1 380 stored a 1-bit, or decreases if memory cell M1 380 stored a 0-bit. Thereafter, sense amplifier 322 compares the voltage in digit line D1 316 against the voltage in digit line D1* 318. Because of the shared buried contacts 344, 354, operation of memory cell M2 382 occurs similarly through the activation of wordline WL1 360, 362 and the coupling of charge from capacitors 348, 350 with digit line D1 316 and digit line D1* 318 through pass transistors 346, 352.

In the present embodiment of the invention, the refresh margin may be improved through processing a memory cell that is not statically bound to a fixed cell plate voltage but is processed to include a dynamic cell plate node that is not fixed to a static voltage. In a memory cell architecture that includes a 2T (two transistor) memory cell, a common node or common capacitor interconnect 384 connects or associates the 2C (two capacitors) of memory cell M1 380 with each other by isolating the cell plate node from an otherwise continuous cell plate conductor or cell plate node layer that conventionally couples to each of the memory cells in a conventional memory array. In the various embodiments of the present invention, improvements in refresh margin may be obtained by modification to the continuous cell plate node layer by forming the common capacitor interconnects 384, 386 from individual isolated conductive islands in the otherwise continuous cell plate node layer that electrically couples the storage capacitors in a series configuration without further connecting the common node to a static cell plate voltage.

Figure 6:
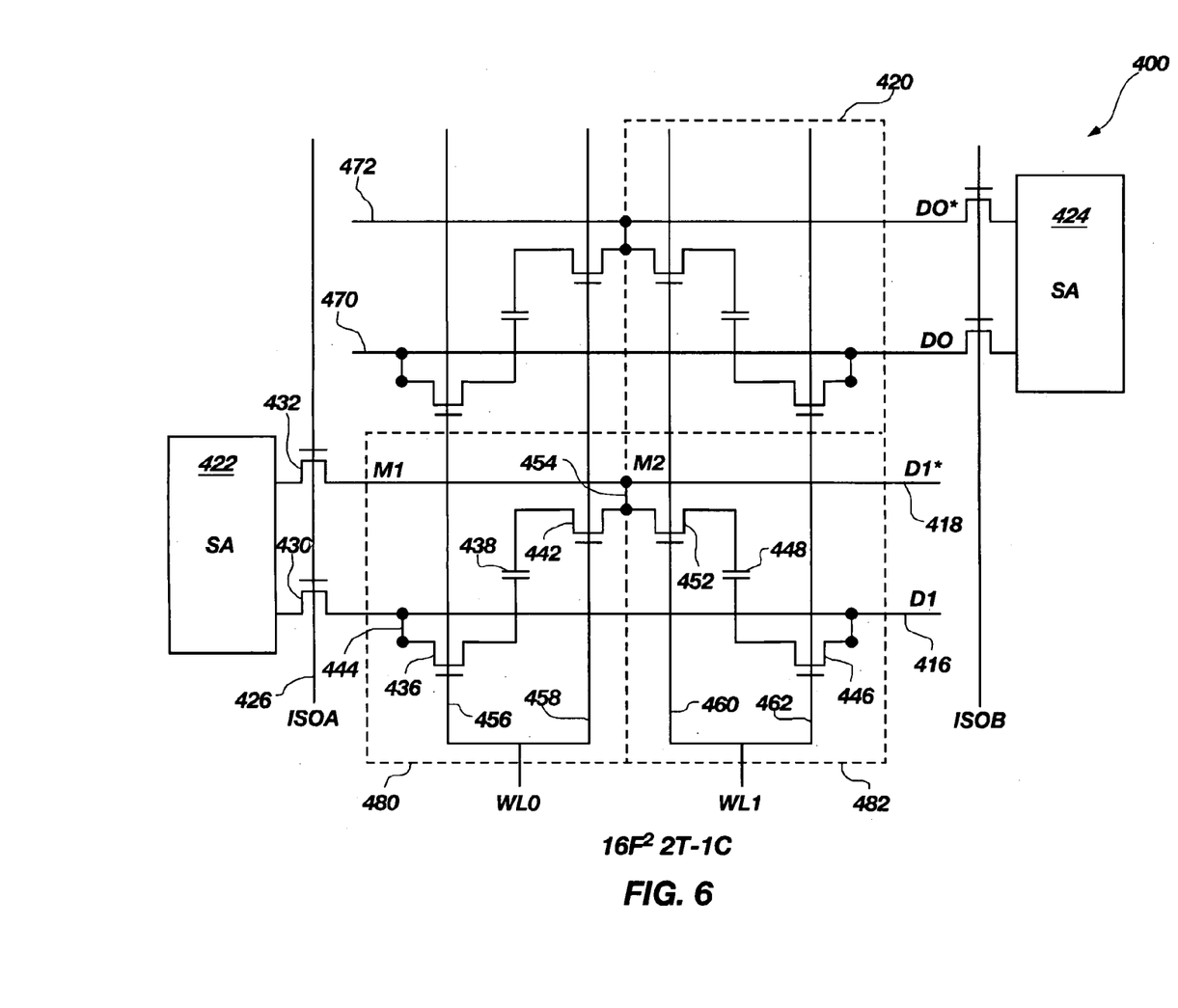
FIG. 6 is a schematic diagram of a dynamic random access memory array, in accordance with yet another embodiment of the present invention.

Referring to FIG. 6, a schematic diagram of a memory array 400 according to one embodiment of the present invention including a portion of a memory cell of an open digit line DRAM array is illustrated, wherein the 2T-1C memory cells have an area of 16F$^2$. For clarity, a single memory cell 420 is depicted in an upper portion of the array and is shown to include one capacitor (1C) and two transistors (2T) and is coupled to a sense amplifier 424 when isolation gates 430, 432 are activated by a sense amp isolation signal 426.

As illustrated, a sense amplifier 422 is coupled between digit line D1 416 and complementary digit line D1* 418 when isolation gates 430, 432 are activated by a sense amp isolation signal 426 and another sense amplifier 424 is coupled between digit line D0 470 and complementary digit line D0* 472 when isolation gates 430, 432 are activated by a sense amp isolation signal 426. Cells with a "1" bit can be expressed as having a +(Vcc−Vss)/2 stored on the capacitor 438 and cells with a "0" bit can be expressed as having a −(Vcc−Vss)/2 stored on the capacitor 438. To read a memory cell, a digit line coupled to the cell and its complementary digit line are first initially equilibrated to Vcc/2 volts. Applying Vcc/2 bias voltage to the digit lines and then allowing the digit lines to float causes the digit lines to be equilibrated to Vcc/2 volts. Once the digit lines have been equilibrated to Vcc/2 volts, they remain in that state due to their capacitance. A voltage that is at least one transistor Vth above Vcc (this voltage is referred to as Vccp) is then applied to a wordline coupled to the cell to be read. For example, if memory cell M1 480 is to be read, a voltage of Vccp is applied to wordline WL0 456, 458 to activate the pass transistors 436, 442 after the digit lines D1 416 and D1* 418 are equilibrated to Vcc/2. The charge on the capacitor of memory cell M1 480 is shared with digit line D1 416. In response to the shared charge, the voltage on the digit line of memory cell M1 480 either increases if memory cell M1 480 stored a 1-bit, or decreases if memory cell M1 480 stored a 0-bit. Thereafter, sense amplifier 422 compares the voltage in digit line D1 416 against the voltage in digit line D1* 418. Because of the shared buried contacts 444, 454, operation of memory cell M2 482 occurs similarly through the activation of wordline WL1 460, 462 and the coupling of charge from capacitor 448 with digit line D1 416 and digit line D1* 418 through pass transistors 446, 452.

In the present embodiment of the invention, the refresh margin may be improved through processing a memory cell that is not statically bound to a fixed cell plate voltage but is processed to include a dynamic cell plate node that is not fixed to a static voltage. In a memory cell architecture that includes a 2T (two transistor) memory cell M1 480, a common capacitor 438 connects and isolates the cell plate node from an otherwise continuous cell plate node layer that conventionally couples to each of the memory cells in a conventional memory array. In the various embodiments of the present invention, improvements in refresh margin may be obtained by modification to the otherwise continuous cell plate node layer by forming the common capacitor 438 without further connecting to a static cell plate voltage.

Figure 7:
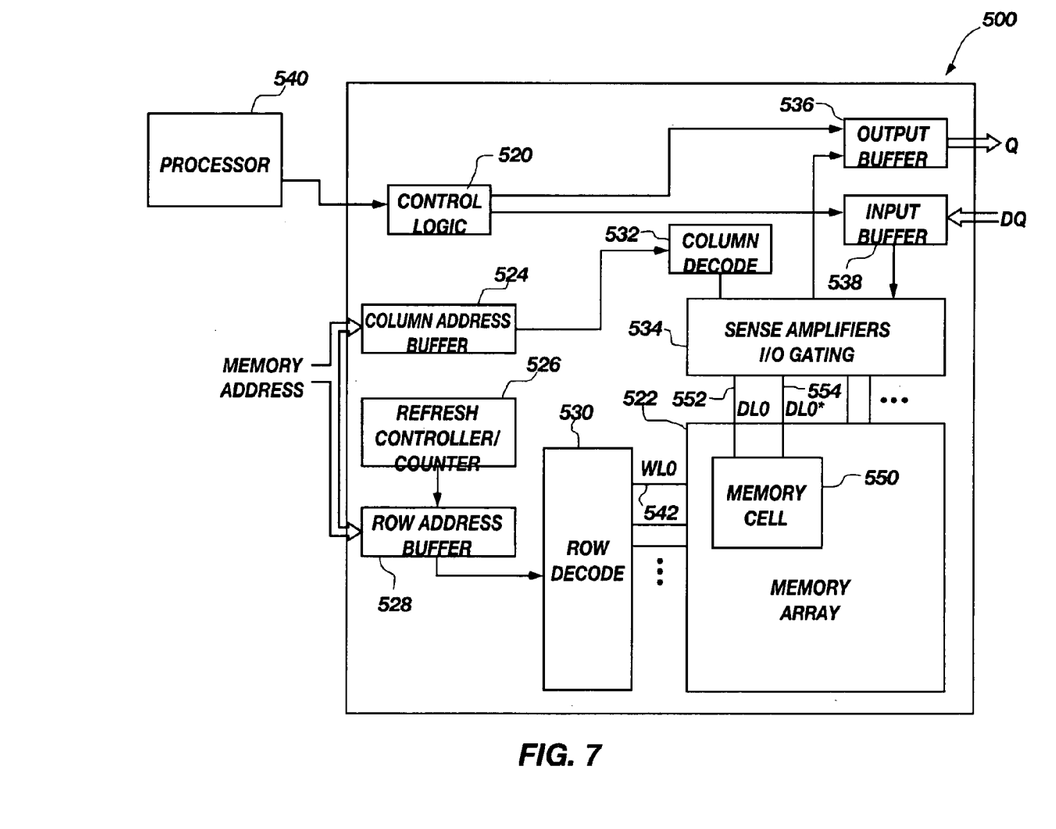
FIG. 7 is a block diagram of a memory device, in accordance with an embodiment of the present invention.

FIG. 7 is a block diagram of a memory device and system, in accordance with an embodiment of the present invention. A DRAM memory device 500 includes control logic circuit 520 to control read, write, erase and perform other memory operations. A column address buffer 524 and a row address buffer 528 are adapted to receive memory address requests. A refresh controller/counter 526 is coupled to the row address buffer 528 to control the refresh of the memory array 522. A row decode circuit 530 is coupled between the row address buffer 528 and the memory array 522. A column decode circuit 532 is coupled to the column address buffer 524. Sense amplifiers-I/O gating circuit 534 is coupled between the column decode circuit 532 and the memory array 522. The DRAM memory device 500 is also illustrated as having an output buffer 536 and an input buffer 538. An external processor 540 is coupled to the control logic circuit 520 of the DRAM memory device 500 to provide external commands.

A memory cell M1 550 of the memory array 522 is shown in FIG. 7 to illustrate how associated memory cells are implemented in the present invention. States or charge are stored in the memory cell M1 550 that correspond to a data bit. A wordline WL0 542 is coupled to the gates of the memory cell M1 550. When the wordline WL0 542 is activated, the charge stored in memory cell M1 550 is discharged to digit lines DL0 552 and DL0* 554. Digit line DL0 552 and digit line DL0* 554 are coupled to a sense amplifier in circuit 534. Although the memory cell M1 550 is illustrated as being coupled to one wordline WL0 542 in FIG. 7, it will be appreciated by those in the art that a pair of wordlines (i.e., WL0 and WL1) that are fired at the same time (e.g., memory cell of FIGS. 5 and 6) could be used, and the present invention is not limited to one wordline for each memory cell.

Figure 8:
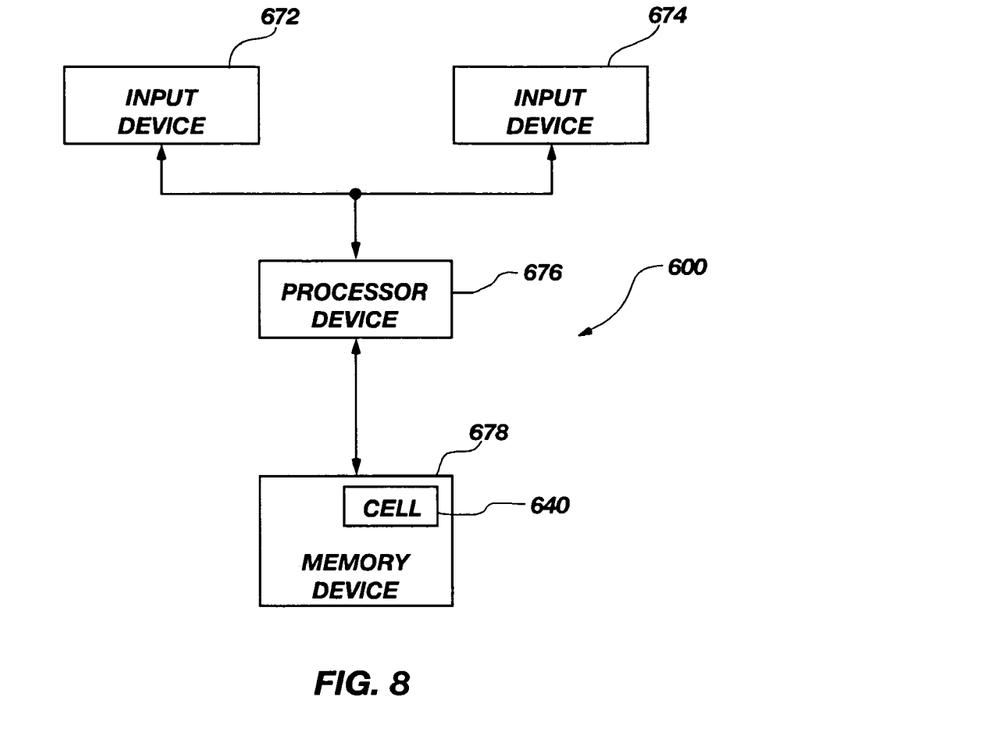
FIG. 8 is a block diagram of an electronic system, in accordance with an embodiment of the present invention.

FIG. 8 is a block diagram of an electronic system, in accordance with an embodiment of the present invention. The electronic system 600 includes an input device 672, an output device 674, and a memory device 678, all coupled to a processor device 676. The memory device 678 incorporates at least one memory cell 640 of one or more of the preceding embodiments of the present invention.

Figure 9:
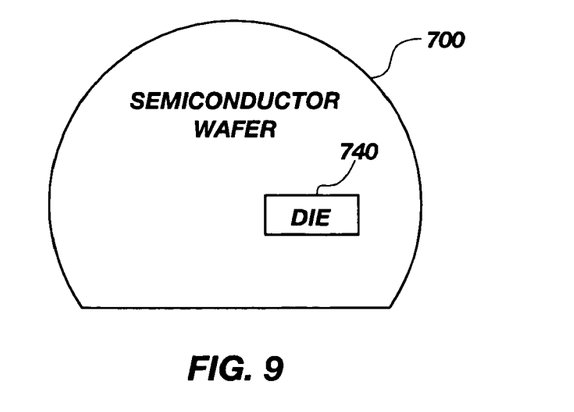
FIG. 9 is a diagram of a semiconductor wafer including an integrated circuit die incorporating a memory cell of one or more of the previous embodiments, in accordance with a further embodiment of the present invention.

FIG. 9 is a diagram of a semiconductor wafer including an integrated circuit die incorporating the memory array of one or more of the previous embodiments, in accordance with a further embodiment of the present invention. As shown in FIG. 9, a semiconductor wafer 700 includes a yet-to-be-cut integrated circuit die 740 that incorporates one or more memory cells as herein disclosed.

The various embodiments of the present invention as described herein provide for an improved refresh margin by applying a dynamic cell plate to a 2T architecture memory cell. Instead of a common cell plate node connected to a voltage generator, each pair of pass transistors and one or more storage capacitors associated to a given address or memory cell/bit has a floating isolated cell node which connects to the capacitive elements. In a conventional memory cell layout, changes to processing may be minimized and result in as little as a single layer change in a conventional or typical DRAM process. While additional embodiments have been disclosed which include a single capacitive element, such process alterations are also minimized but may incur more deviations from a standard or typical DRAM process than with a dual or two capacitor memory cell.

Although specific embodiments have been illustrated and described herein, it will be appreciated by those of ordinary skill in the art that any arrangement calculated to achieve the same purpose may be substituted for the specific embodiments shown. This application is intended to cover any adaptations or variations of the present invention. Therefore, it is manifestly intended that this invention be limited only by the claims and the equivalents thereof.

What is claimed is:

1. A memory cell, comprising:
  a first portion of the memory cell, including a first pass transistor and a first capacitor coupled in series and configured for coupling in series between a first digit line at a port of the first pass transistor and a cell plate conductor at a terminal end of the first capacitor, the first pass transistor configured to be controlled by a first wordline;
  a second portion of the memory cell, including a second pass transistor and a second capacitor coupled in series and configured for coupling in series between a second digit line at a port of the second pass transistor and the cell plate conductor at a terminal end of the second capacitor, the second pass transistor configured to be controlled by the first wordline, the second portion and the first portion symmetrically configured with respect to each other; and
  an interconnection formed on the cell plate conductor between the terminal end of the first capacitor and the terminal end of the second capacitor, the interconnection being electrically isolated from other portions of the cell plate conductor.

2. The memory cell of claim 1, wherein each of the first portion and the second portion of the memory cell in a plan view has an area of substantially $6F^2$.

3. The memory cell of claim 1, wherein each of the first portion and the second portion of the memory cell in a plan view has an area of substantially $8F^2$.

4. The memory cell of claim 3, wherein the second pass transistor is configured to be controlled by a second wordline and the first and second wordlines are electrically connected and controlled by a common wordline driver.

5. The memory cell of claim 1, wherein the first and second digit lines are configured in an open digit line architecture.

6. The memory cell of claim 1, wherein the first and second capacitors are configured as stacked capacitors.

7. The memory cell of claim 1, wherein the first and second capacitors are formed as a common capacitor.

8. A memory device, comprising:
  a memory array including a plurality of memory cells, wherein each of the plurality of memory cells includes a first and a second pass transistor and a first and a second capacitor, the first pass transistor and the first capacitor and the second pass transistor and the second capacitor each configured in series for individual respective coupling between a first digit line and a second digit line, the first and second pass transistors further configured for respective control by a first wordline, the first pass transistor and first capacitor being symmetrically configured with the second pass transistor and second capacitor, the memory cell further including an interconnection formed on a cell plate conductor between a terminal end of the first capacitor and a terminal end of the second capacitor, the interconnection being electrically isolated from other portions of the cell plate conductor; and
  a plurality of sense amplifiers configured for selectably coupling with pairs of the first and second digit lines.

9. The memory device of claim 8, wherein each of the plurality of memory cells in a plan view has an area of substantially $12F^2$.

10. The memory device of claim 8, wherein each of the plurality of memory cells in a plan view has an area of substantially $16F^2$.

11. The memory device of claim 10, wherein the second pass transistor is configured to be controlled by a second wordline and the first and second wordlines are electrically connected and controlled by a common wordline driver.

12. The memory device of claim 8, wherein the first and second digit lines are configured in an open digit line architecture.

13. The memory device of claim 8, wherein the first and second capacitors of the memory cell are configured as stacked capacitors.

14. The memory device of claim 8, wherein the first and second capacitors are formed as a common capacitor.

15. A semiconductor wafer including an integrated circuit configured as a memory array, the memory array including a plurality of memory cells, wherein each of the plurality of memory cells includes a first and a second pass transistor and a first and a second capacitor, the first pass transistor and first capacitor and the second pass transistor and the second capacitor each configured in series for individual respective coupling between a first digit line and a second digit line, the first and second pass transistors further configured for respective control by a first wordline, the first pass transistor and the first capacitor being symmetrically configured with the second pass transistor and the second capacitor, each memory cell further including an interconnection formed on a cell plate conductor between a terminal end of the first capacitor and a terminal end of the second capacitor, the interconnection being electrically isolated from other portions of the cell plate conductor.

16. The semiconductor wafer of claim 15, wherein the cell plate conductor is configured as discrete segments of a single electrically conductive layer of the semiconductor wafer.

17. An electronic system including an input device, an output device, a memory device, and a processor device coupled to the input, output and memory devices, the memory device comprising a memory array including a plurality of memory cells, wherein each of the plurality of memory cells includes a first and a second pass transistor and a first and a second capacitor, the first pass transistor and the first capacitor and the second pass transistor and the second capacitor each configured in series for individual respective coupling between a first digit line and a second digit line, the first and second pass transistors further configured for respective control by a first wordline, the first pass transistor and the first capacitor being symmetrically configured with the second pass transistor and the second capacitor, each memory cell further including an interconnection formed on a cell plate conductor between a terminal end of the first capacitor and a terminal end of the second capacitor, the interconnection being electrically isolated from other portions of the cell plate conductor.

18. A method of operating a memory array, comprising:
charging series configured symmetrical first and second capacitors to a logic potential through opposing series configured first and second pass transistors respectively coupled to first and second digit lines;
pre-charging the first and second digit lines to an intermediate reference;
discharging the logic potential of the first and second capacitors through the first and second pass transistors coupled to the first and second digit lines; and
sensing at least a portion of the logic potential on the first and second digit lines to determine a logic state.

19. The method of claim 18, wherein the series configured symmetrical first and second capacitors are coupled by an electrically isolated interconnection.

20. The method of claim 18, wherein the first pass transistor and the first capacitor in a plan view have an area of substantially $6F^2$.

* * * * *